United States Patent [19]

Hawkins et al.

[11] Patent Number: 5,075,250
[45] Date of Patent: Dec. 24, 1991

[54] METHOD OF FABRICATING A MONOLITHIC INTEGRATED CIRCUIT CHIP FOR A THERMAL INK JET PRINTHEAD

[75] Inventors: William G. Hawkins, Webster; Cathie J. Burke, Rochester, both of N.Y.

[73] Assignee: Xerox Corporation, Stamford, Conn.

[21] Appl. No.: 636,826

[22] Filed: Jan. 2, 1991

[51] Int. Cl.$^5$ .......................................... H04L 21/70
[52] U.S. Cl. ..................................... 437/52; 437/60; 437/918; 437/47; 148/DIG. 136
[58] Field of Search ............... 437/52, 60, 47, 918, 437/59; 148/DIG. 136; 357/51

[56] References Cited

U.S. PATENT DOCUMENTS

| 4,080,618 | 3/1978 | Tango et al. | 357/51 |
| 4,265,685 | 5/1981 | Seki | 437/47 |
| 4,290,185 | 9/1981 | McKenny et al. | 437/47 |
| 4,429,321 | 1/1984 | Matsumoto | 346/140 R |
| 4,602,421 | 7/1986 | Lee et al. | 148/DIG. 136 |
| 4,947,192 | 8/1990 | Hawkins et al. | 346/140 R |
| 5,013,677 | 5/1991 | Hozumi | 437/60 |

FOREIGN PATENT DOCUMENTS

| 0140488 | 10/1979 | Japan | 357/51 |
| 0025244 | 2/1984 | Japan | 437/918 |

Primary Examiner—Brian E. Hearn
Assistant Examiner—Michael Trinh
Attorney, Agent, or Firm—Duane C. Basch

[57] ABSTRACT

A thermal jet ink printing is provided with an improved printhead. The printhead is formed by monolithic integration of MOS logic elements and drivers onto the same silicon substrate containing the resistive elements using a more efficient manufacturing process. In a preferred embodiment, the logic switches, logic drivers and resistive elements are formed from a single layer of polysilicon with the resistive element formed on a thermally grown field oxide layer. The integrated circuit chips are formed by a MOS fabrication technology which uses fewer processing steps than used in existing chips, and the resulting chips are thermally stable and can be operated at higher logic voltages.

12 Claims, 8 Drawing Sheets

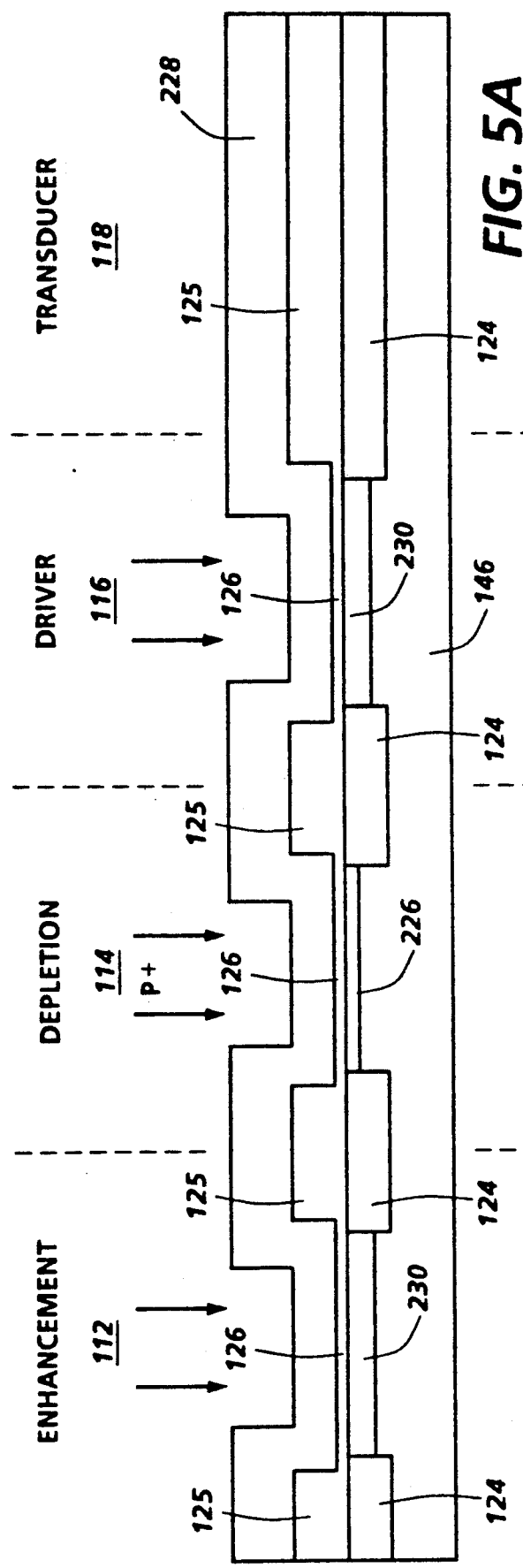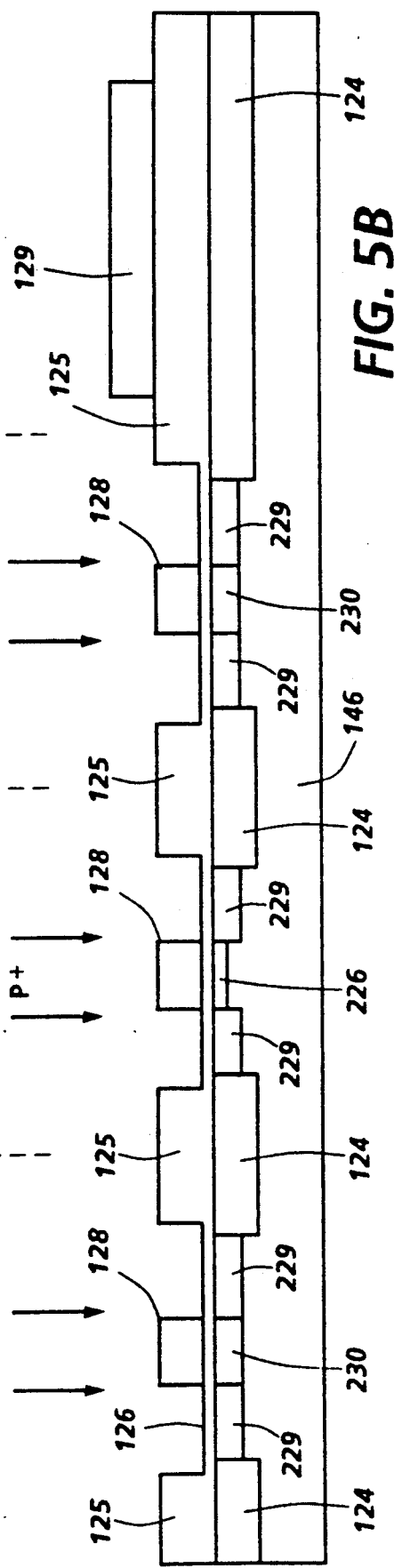

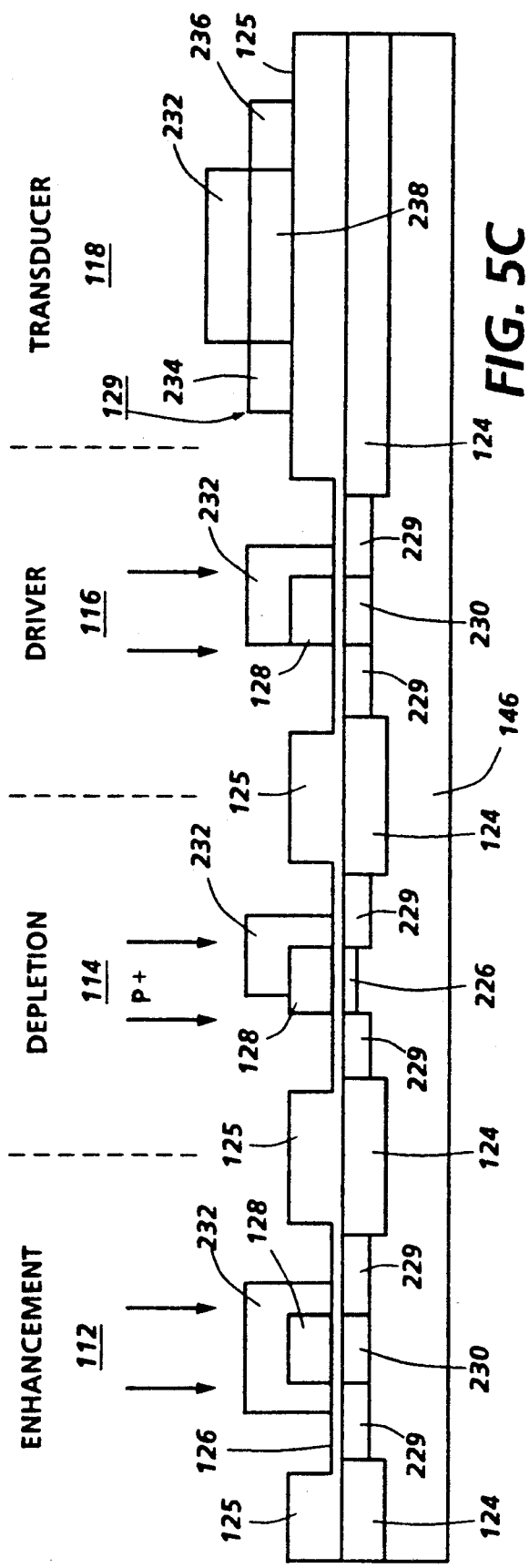
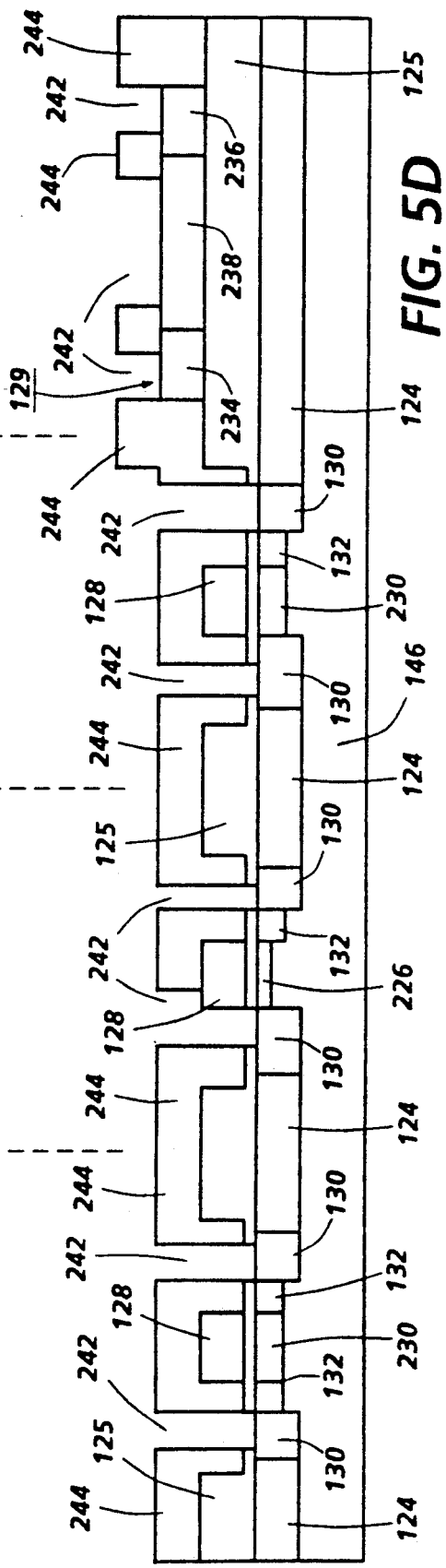

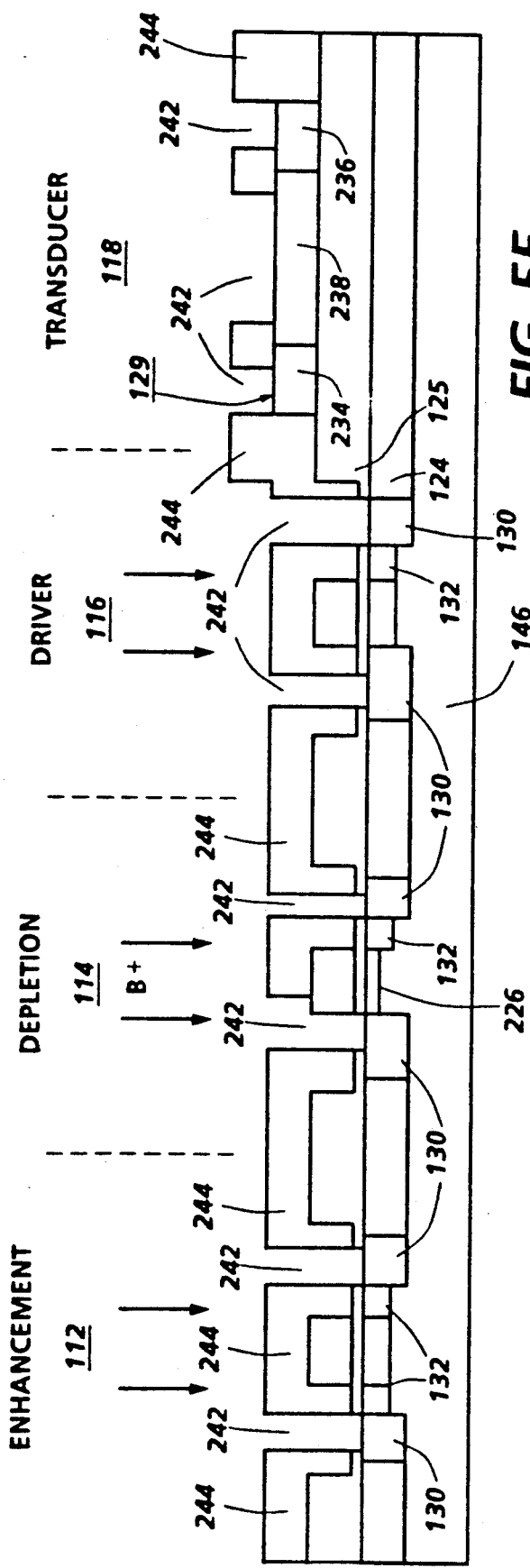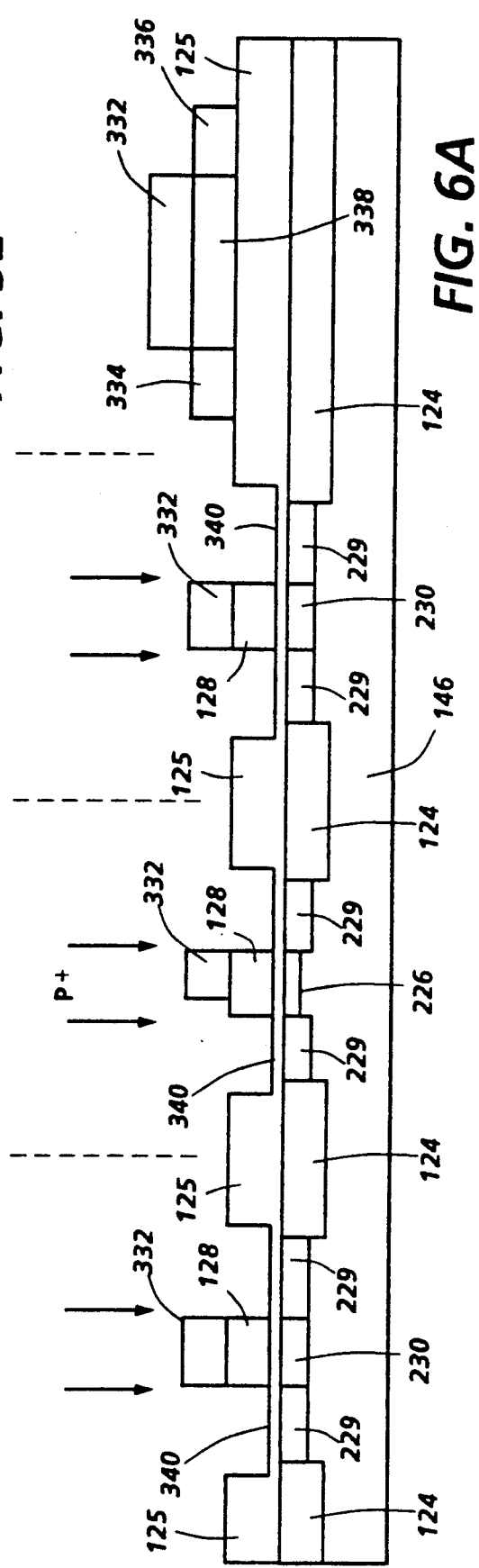

METHOD OF FABRICATING A MONOLITHIC INTEGRATED CIRCUIT CHIP FOR A THERMAL INK JET PRINTHEAD

BACKGROUND OF THE INVENTION

1. Field of the Invention

This invention relates to bubble ink jet printing systems and, more particularly, to an improved integrated circuit chip for use in a thermal ink jet printhead which contains active driver, logic and resistive heater elements and a method for making the chip.

2. Description of Related References

Drop-on-demand thermal ink jet printers are generally well known, and in such systems a thermal printhead comprises one or more ink filled channels communicating with a relatively small ink supply chamber and a linear array of orifices, generally referred to as nozzles. A plurality of thermal transducers, usually resistors, are located in the channels at a predetermined location relative to the nozzles. The resistors are individually addressed with a current pulse to momentarily vaporize the ink in contact therewith and form a bubble which expels an ink droplet. As the bubble grows, the ink bulges from the nozzle and is contained by the surface tension of the ink as a meniscus. As the bubble begins to collapse, the ink between the nozzle and bubble starts to move towards the collapsing bubble, causing a volumetric contraction of the ink at the nozzle and resulting in the separation of the bulging ink as a droplet. The acceleration of the ink out of the nozzle while the bubble is growing provides the momentum and velocity required for the droplet to proceed in a substantially straight line direction towards a recording medium, such as paper.

In order to generate the resistor current pulses, some type of active driver device must be employed. Preferably, the driver circuitry should be formed on the same chip as the resistive elements. It is generally known to utilize bipolar or less expensive MOS type circuitry as the active driver devices. A typical device which utilizes bipolar type circuitry is disclosed in U.S. Pat. No. 4,429,321 to Matsumoto. In the Matsumoto patent, a liquid jet recording device is disclosed, wherein a method of fabricating the device is shown which incorporates a control unit and a transducer on a single substrate. The control unit in this recorder is a bipolar type of transistor. A method of doping using various implants to create a resistor is shown (see Table 1). A base region of the bipolar transistor is fabricated using boron doping. Unfortunately, bipolar transistors exhibit destructive thermal run away when switching high currents. Therefore, it is desirable and generally more cost effective to have a resistor structure which is immediately and simply integrated on the same wafer with an accompanying MOS driver.

For example, U.S. Pat. No. 4,947,192 to Hawkins et al. discloses a monolithic silicon integrated circuit chip for a thermal ink jet printer wherein a MOS transistor and a resistor are formed on the same substrate. A lightly doped source and drain layer is shown. The relevant portions of the disclosure of U.S. Pat. No. 4,947,192 issued to Hawkins et al., are hereby incorporated by reference into this specification.

The Hawkins et al. reference describes the importance of combining driver and transducer elements on a single chip. Moreover, the reference indicates the potential for adding logic circuitry capable of addressing an arbitrarily large number of ink jets with minimal electrical connections. Such a monolithic device, having logic elements, drivers, and transducers incorporated therein, would generally require added photoresist masking and implant steps to produce enhancement and depletion mode logic devices. While such a structure is desirable, the added processing steps result in potentially higher yield losses and manufacturing costs. A device of this type may be achieved using a single polysilicon layer, as indicated by Hawkins et al. Specifically, The source-drain n+ contacts are doped with arsenic, while polysilicon is doped with phosphorous to create low resistivity (25 $\Omega/\square$) material at the ends of the transducers. Unfortunately, such a structure would require at least two additional processing steps to implant the arsenic and phosphorous in their respective locations. This would result in an eleven mask step process to create the structure previously disclosed in the Hawkins et al. reference.

SUMMARY OF THE INVENTION

It is, therefore, an object of the present invention, to provide a more reliable monolithic silicon semiconductor integrated chip incorporating MOS transistor control logic, drivers, and resistive heater elements.

It is another object of the present invention to provide an improved NMOS fabrication technique so as to provide an ink jet printing head that requires less processing steps in its manufacture, and is, therefore, more cost effective to manufacture than prior art devices.

It is yet another object of the present invention to produce, using a self aligned p+ implant, a thermal ink jet printhead having a suppressed power MOS driver parasitic bipolar effect.

It is an additional object of the present invention to provide a monolithic thermal ink jet printhead having phosphorous doped sourcedrain regions and resistor ends to achieve lightly doped drain structures in the logic and driver sections, while simultaneously reducing the resistance of the resistor ends, thereby reducing the parasitic resistance of the resistors.

It is still another object of the present invention to produce, by utilizing a borophosphosilicate reflow glass, a monolithic thermal ink jet circuit chip having phosphorous doped source-drain regions and resistor ends, thereby reducing the parasitic resistance of the resistors.

The present invention is therefore directed to an improved monolithic silicon integrated circuit chip, and process for producing the aforementioned monolithic device, for use in an ink jet printing system. More particularly, the invention relates to methods by which mask and implant steps can be combined to reduce the number of critical processing steps, thereby reducing the overall cost of such a device. Specifically, the present invention is directed at replacing the separate arsenic (As) source-drain and phosphorous polysilicon masking and implant steps with a single phosphorous masked implant step. Previously, such a combination was undesirable, as the phosphorous doping of the source-drain contacts caused lateral diffusion under the 5 micron ($\mu$m) gates during glass reflow. The lateral diffusion of the phosphorous was sufficient to cause serious degradation, or even shorting, of the logic devices. However, this invention includes techniques for reducing the lateral diffusion problems.

The present invention utilizes methods of achieving a single phosphorous masked implant, which are directed towards reducing the lateral encroachment of the phosphorous doped source-drain contact regions. In one method, a n-drift layer implant is employed to compensate for the lateral diffusion of the phosphorous. A second method utilizes a borophosphosilicate glass as the reflow glass to reduce the amount of lateral diffusion of the phosphorous during the reflow cycle. Moreover, the combination of the two slightly different methods produces no deleterious effects in the resulting monolithic device.

The present invention further eliminates a second mask level by self-aligning the boron substrate contact to the etched vias in the reflow glass layer. The self-aligned boron substrate contact makes use of boron diffusivity suppression in n+ silicon. Areas which are desired for substrate contact are shielded from the phosphorous n+ implant, leaving the substrate doped with the n− drift region. Upon etching vias through the reflow glass and oxide layers, vias to be made into substrate contacts have n− drift regions, and sources, drains, and gates are n+ doped. Subsequently, the selfaligned boron implant is introduced through the vias, where the high diffusivity of boron in n− regions causes compensation and conversion to p+ regions, as well as, penetration of the n− layer. In the n+ regions, boron is totally contained within the region due to suppression of its diffusivity within the region.

BRIEF DESCRIPTION OF THE DRAWINGS

For a more complete understanding of the invention, detailed example embodiments thereof will now be described with reference to the accompanying drawings, in which:

FIGS. 5a-5e are enlarged, cross-sectional views of the process steps for fabricating the integrated circuit chip of the present invention.

FIGS. 6a-6c are enlarged, cross-sectional views of alternate process steps for fabricating the integrated circuit chip of the present invention.

DESCRIPTION OF THE PREFERRED EMBODIMENT

Figure 1:
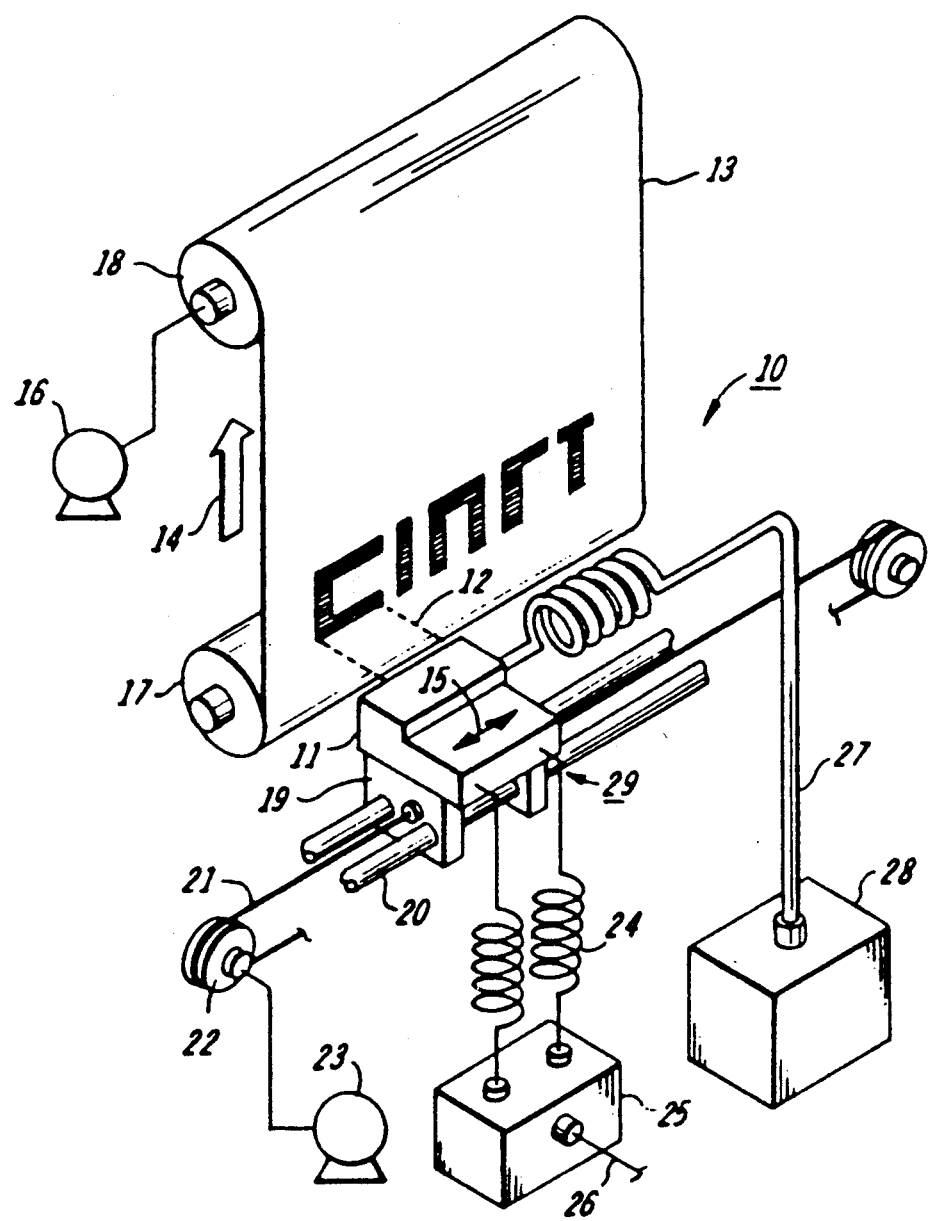
FIG. 1 is a schematic perspective view of a carriage type bubble jet ink printing system having a printhead which incorporates the present invention.

The printers which make use of thermal ink jet transducers can contain either stationary paper and a moving print head or a stationary pagewidth printhead with moving paper. A carriage type bubble jet ink printing device 10 is shown in FIG. 1. A linear array of droplet producing ink jet channels is housed in the printing head 11 of reciprocating carriage assembly 29. Droplets 12 are propelled to the recording medium 13 which is stepped by stepper motor 16 a preselected distance in the direction of arrow 14 each time the printing head traverses in one direction across the recording medium in the direction of arrow 15. The recording medium, such as paper, is stored on supply roll 17 and stepped onto roll 18 by stepper motor 16 by means well known in the art.

The printing head 11 is fixedly mounted on support base 19 which is adapted for reciprocal movement by any well known means such as by two parallel guide rails 20. The printing head base comprise the reciprocating carriage assembly 29 which is moved back and forth across the recording medium in a direction parallel thereto and perpendicular to the direction in which the recording medium is stepped. The reciprocal movement of the head is achieved by a cable 21 and a pair of rotatable pulleys 22, one of which is powered by a reversible motor 23.

The current pulses are applied to the individual bubble generating resistors in each ink channel forming the array housed in the printing head 11 by connections 24 from a controller 25. The current pulses which produce the ink droplets are generated in response to digital data signals received by the controller through electrode 26. The ink channels are maintained full during operation via hose 27 from ink supply 28.

Figure 2:
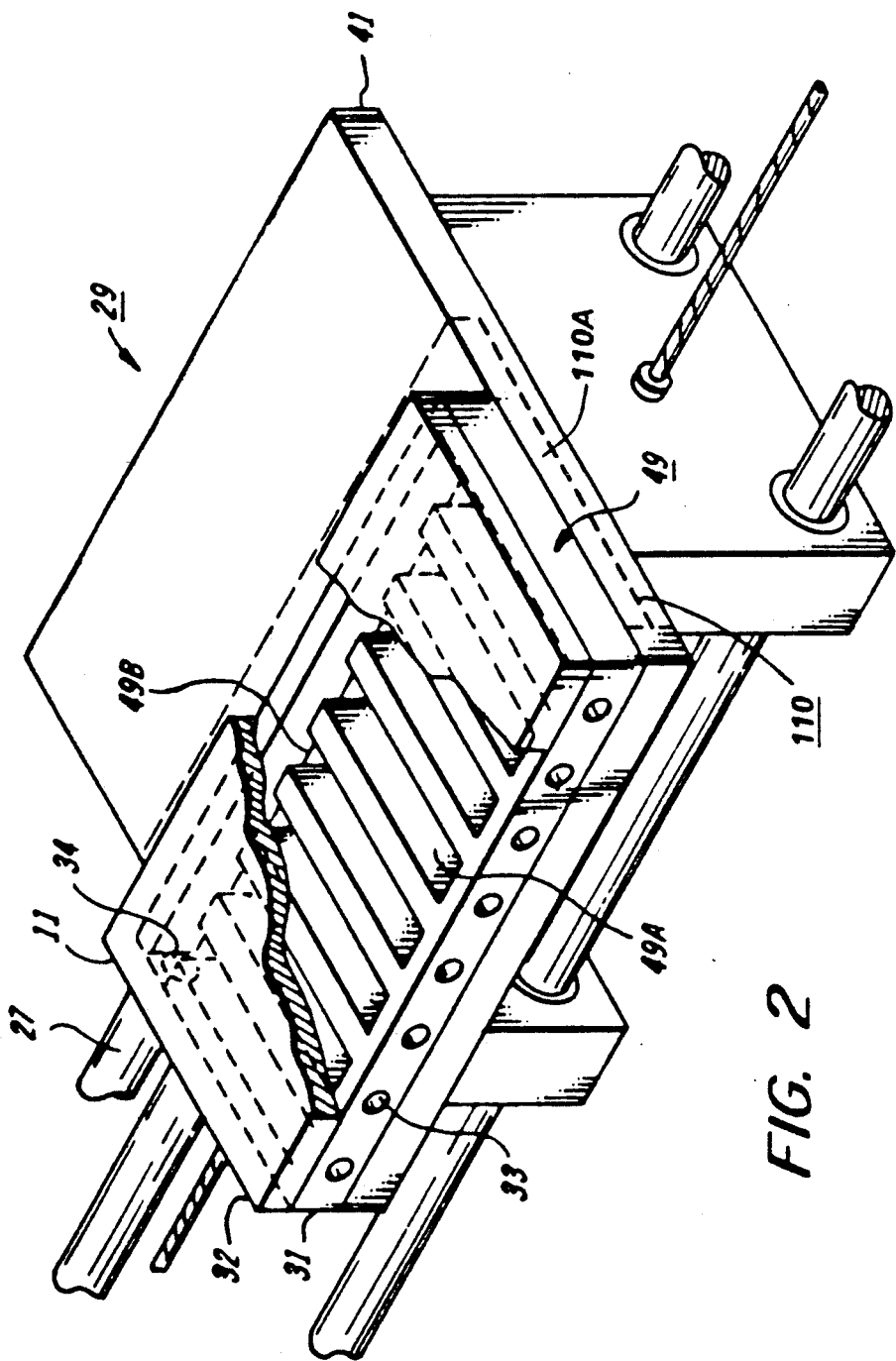
FIG. 2 is an enlarged schematic perspective view of the bubble jet ink printing head of FIG. 1.

FIG. 2 is an enlarged, partially sectioned, perspective schematic of the carriage assembly 29 shown in FIG. 1. The printing head 11 is shown in three parts. One part is the substrate 41 containing the electrical leads and monolithic silicon semi-conductor integrated circuit chip 110 therein in the region 110A shown in dashed line. The next two parts comprise the channel plate 49 having ink channels 49a and manifold 49b. Although the channel plate 49 is shown in two separate pieces 31 and 32, the channel plate could be an integral structure. The ink channels 49a and ink manifold 49b are formed in the channel plate piece 31 having nozzles 33 at the end of each ink channel opposite the end connecting the manifold 49b. The ink supply hose 27 is connected to the manifold 49b via a passageway 34 in channel plate piece 31 shown in dashed line. Channel plate piece 32 is a flat member to cover channel 49a and ink manifold 49b as they are appropriately aligned and fixedly mounted on the silicon substrate. In an alternate printhead configuration (not shown), the nozzles are located from channel plate piece 31 to the flat channel plate piece 32 and at a position directly over the thermal transducer or resistors to form a printhead which ejects droplets in a direction normal to the resistors.

Figure 3:
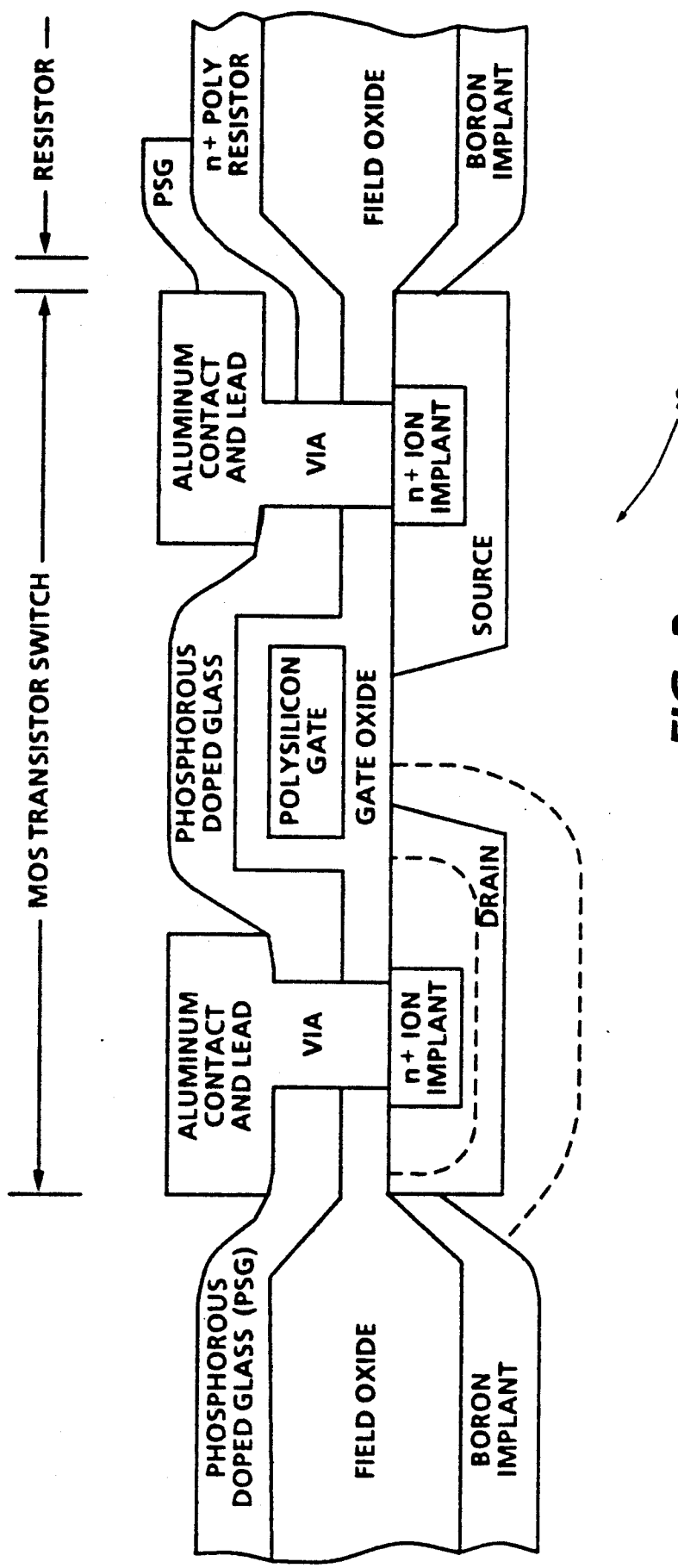
FIG. 3 is an enlarged, cross-sectional view of a prior art silicon logic integrated circuit, as disclosed by Hawkins et al. in U.S. Pat. No. 4,947,192.

The prior art integrated circuit chip 48, shown in FIG. 3, is formed, to some extent, according to standard NMOS process steps but modified in certain respects, as described in full detail in U.S. Pat. No. 4,947,192 to Hawkins et al. In order to appreciate the process steps required to produce the prior art chip of FIG. 3, one is referred to this Hawkins et al. patent which has been incorporated by reference. FIG. 3 shows an active address chip 48 having an MOS transistor switch monolithically integrated on the same substrate with the resistor by a fabrication process requiring eleven masks. The chip is constructed by techniques disclosed by Hawkins et al. in U.S. Pat. No. 4,947,192, the techniques resulting in improved performance as described therein.

Figure 4:
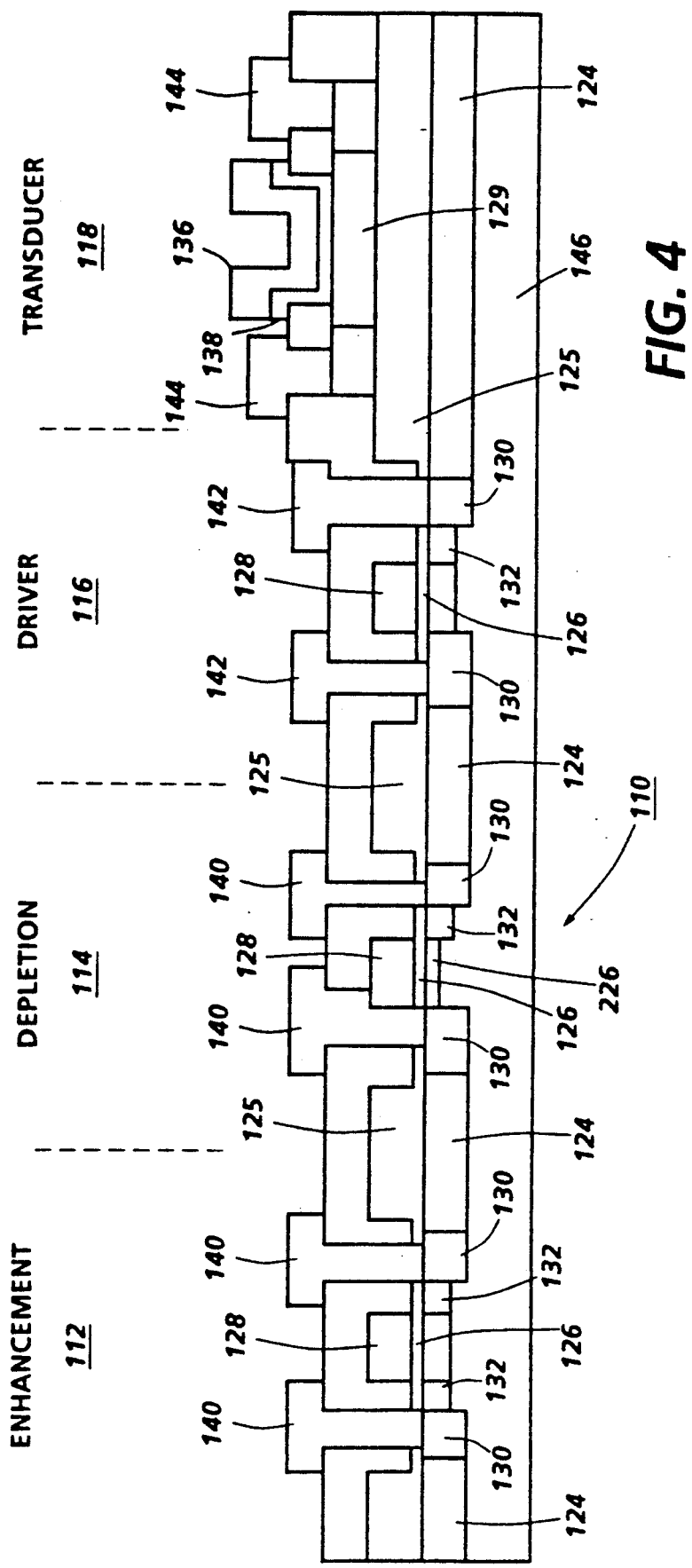
FIG. 4 is an enlarged, cross-sectional view of an embodiment of the integrated circuit chip of the present invention.

With respect to the present invention, integrated circuit chip 110, illustrated in FIG. 4, is formed using a modified NMOS process. The modifications, discussed in detail below, yield a less complex masking process, thereby resulting in a lower cost monolithic integrated circuit chip having control logic, drivers, and transducers integrated thereon. The chip also has higher breakdown voltages for the logic devices than other prior art devices. Referring now to FIG. 4, integrated circuit chip 110 is divided into 4 types of electrical elements; viz., logic enhancement element 112, logic depletion element 114, driver 116 and thermal transducer 118. The chip is constructed by modifying the techniques used to make the structure of FIG. 3, thereby resulting in a lower cost, higher yield process for producing chips with improved performance.

As disclosed in U.S. Pat. No. 4,947,192 but not shown in the accompanying drawings, a P type silicon wafer 146, having front and back surfaces, is processed to form a thin $SiO_2$ layer on both surfaces, followed by deposition of a silicon nitride masking layer over the $SiO_2$ layers. A first photoresist mask (not shown) is applied and patterned over the areas which will form the active enhancement and depletion mode device areas 112, 114, and 116. The first photoresist layer is used to pattern the silicon nitride layer (not shown) and then to block channel stop boron implant regions 124 from the active device areas. The patterned first photoresist layer is stripped and the $SiO_2$ layer is etched off using the patterned silicon nitride layer as a mask.

Referring now to FIGS. 5a-5e in conjunction with FIG. 4, a field oxide layer 125 is grown at high temperature after the boron channel stop implant 124 is set and the $SiO_2$ layer thereover is removed. According to a first aspect of the invention, the field oxide layer is at least 1 micron ($\mu$m) thick and preferably 1.5 $\mu$m thick. The patterned silicon nitride layer and underlying $SiO_2$ layer are stripped. Subsequently, a 1000 Å sacrificial oxide layer (not shown) is grown and a second photoresist depletion mask (not shown) is patterned on the surface of the wafer. The sacrificial oxide layer in depletion area 114 is etched off. The depletion mask enables the exposure of only the logic depletion gate areas in the depletion areas 114 to the As+ ions for the depletion implant 226. Next, the depletion mask is stripped, the remaining sacrificial oxide layer is etched off and gate oxide layer 126 is grown over the channel areas. Gate oxide layer 126 is preferably about 900 Å in thickness. A boron implant is conducted through the gate oxide layer and is blocked by the field oxide layer 125. The wafer 146 is presently in the condition illustrated by FIG. 5a, having depletion implant 226 in depletion area 114, and enhancement boron implants 230 in enhancement and driver areas 112 and 116, respectively. Subsequently, a single polysilicon layer 228 of greater than 4000 Å, preferably about 4500 Å, in thickness is deposited and then implanted with n-type ions, preferably phosphorous (P+) ions, to produce n+ polysilicon with a sheet resistance between 5 $\Omega/\square$ and 5 $k\Omega/\square$, preferably about 47 $\Omega/\square$, as shown in FIG. 5a.

The next step in the process is illustrated in FIG. 5b, and involves the patterning and etching of the polysilicon layer 228 shown in FIG. 5a to form the transistor gates 128 and resistor 129 by the deposition and patterning of a third photoresist layer (not shown). Subsequently, the photoresist layer is stripped and n− drift layers 229 are produced by a light, self-aligned P+ drift implant ($2 \times 10^{16}/cm^3$) to produce a layer having a sheet resistance between 500 $\Omega/\square$ and 20 $k\Omega/\square$ but, preferably, about 5 $k\Omega/\square$. When subjected to the drift implant, the polysilicon remains as n+ polysilicon suitable for the gate and resistor regions, indicated by reference numerals 128 and 129, respectively. By self-aligning the n− drift layer 229 to the polysilicon gate 128, breakdown voltage can be extended to values in the range of 80-90 volts. After the drift implant, a masked phosphorous (P+) implant is completed as illustrated in FIG. 5c.

Specifically, the wafer is patterned with a fourth photoresist layer 232 to shield not only portions of the gate and resistor polysilicon, but also portions of the underlying source and drain contact regions 229. In addition, some of the driver source contacts, preferably one in every six, are masked to shield them from the phosphorous implant. These contacts are dispersed about the wafer surface to enable p+ substrate contacts for grounding through the top surface of the wafer, thereby eliminating the parasitic bipolar effect generally associated with grounding through the bottom surface of the wafer. Having photoresist layer 232 applied, the wafer is again exposed to a phosphorous implant, this one for the source-drain contacts. The unmasked regions of polysilicon thereby becoming more highly doped with phosphorous ions. Referring to FIG. 5d, the unmasked regions of the underlying wafer forming highly doped source-drain regions 130, having a sheet resistance of between 15 $\Omega/\square$ and 30 $\Omega/\square$, while those regions of the wafer covered by the fourth masking layer 232 remain as lightly doped source-drain regions, 132. In addition, the unmasked portions of the transducer element polysilicon region also become more highly doped with P+ ions, thereby making the ends, 234 and 236, of the resistor polysilicon layer 129 more conductive than the inner portion of the layer 238. This eventually results in a more efficient resistor configuration as the "hot" portion of the resistor, area 238, is concentrated where the heat will be most efficiently dissipated to the ink. Moreover, the contact regions 234 and 236 on the end of the resistor will remain cooler, thereby prolonging the life of the contacts.

After the phosphorous source-drain implant, shown in FIG. 5c, the fourth photoresist layer 232 is stripped and the wafer is cleaned. Following the growth of a protective oxide layer (not shown) over the polysilicon and source-drain regions, a glass layer 244 is deposited and reflowed across the entire surface of the wafer. The glass is preferably a 7.5% phosphosilicate glass (PSG) that is deposited in a 90 minute reflow cycle at a temperature of about 1000° C.

Alternatively, the glass may be a borophosphosilicate glass (BPSG), because it can be reflowed at a lower temperature and shorter time, thereby eliminating the problem of lateral diffusion of the phosphorous in contacts 130 into the channel regions beneath the gates. Moreover, PSG tends to loose phosphorous by evaporation during reflow, resulting in a lower phosphorous content along the upper surface of the reflow layer 244. During etching, the lower phosphorous content areas etch much more slowly, causing etched vias 242 to have sharp corners. BPSG however, does not suffer from this phosphorous loss problem and, therefore, produces smoother more gradually sloped vias which are more desirable.

Subsequent to the glass reflow cycle, the wafer is again patterned with a fifth photoresist layer (not shown) to enable wet etching of the contact vias 242. Wet etching is used to reduce deleterious effects to polysilicon layer 129, in transducer region 118, which is also re-exposed by the etch process. After wet etching the glass and source-drain oxide layers, the fifth photoresist layer is stripped, resulting in the structure illustrated in FIG. 5d, having vias 242 present in glass layer 244, to provide access to the source-drain contacts and/or polysilicon regions.

Once vias 242 are etched through glass 244 and the oxide layers exposing wafer 146, they form the patterning mechanism for the subsequent self-aligned boron implant as illustrated in step 5e. After the boron (B+) implant, the wafer is cleaned and the implant is activated by heating the wafer to about 1000° C. for a 30 minute period, during which some reflow of the glass within the vias will occur. The following processing steps directed towards completion of the transducer structure, contact circuitry, and protection layers are shown in FIG. 4, where a Si3N4 layer 138 is deposited over the wafer surface, followed by a Ta layer 136. The Tantalum layer is then patterned using a sixth photoresist layer (not shown) and etch procedure, leaving the tantalum layer 136 only over the operative resistor region of transducer 118. Subsequently, the sixth photoresist layer is stripped and the Si3N4 layer is etched, using the Tantalum layer as a mask for the underlying Si3N4 layer 138. Following a cleaning operation, aluminum metallization is applied and patterned with a seventh photoresist layer (not shown) to form interconnections 140, 142, and 144 to the logic, driver and transducer elements on the wafer, respectively. The wafer is then cleaned and protective layers of SiO2, and optionally Si3N4, are deposited and subsequently patterned with an eighth photoresist layer prior to etching to expose the thermal transducer 118 and integrated circuit contact pads (not shown). Subsequently, a thick film polyimide layer (not shown) is deposited over all regions of the wafer and patterned with a ninth photoresist layer, and subsequent etch, to delineate the central portions of the Ta layer 136 over the transducer, thus placing them in pits (not shown), and integrated circuit contact pads.

The use of a set-back source-drain photoresist pattern 232 enables the elimination of one photoresist patterning and etch process, by eliminating the need for an additional arsenic implant. Furthermore, the use of the self aligned boron implant, illustrated in FIG. 5e, eliminates the need for a boron implant patterning operation. The above process eliminates two patterning operations from the previously required eleven mask process disclosed in U.S. Pat. No. 4,947,192. These patterning operations are extremely cost intensive and the elimination of two mask levels results in cost savings of approximately twenty percent over the process previously used for thermal ink jet printhead chips.

In an alternate embodiment, the aforedescribed arsenic and phosphorous masking and implant steps which were combined into a single phosphorous masked implant step utilizes the lower temperature processing enabled by the borophosphosilicate glass (BPSG), thereby allowing the use of self-aligned phosphorous contacts in the logic sections of the chip.

Figure 6B:
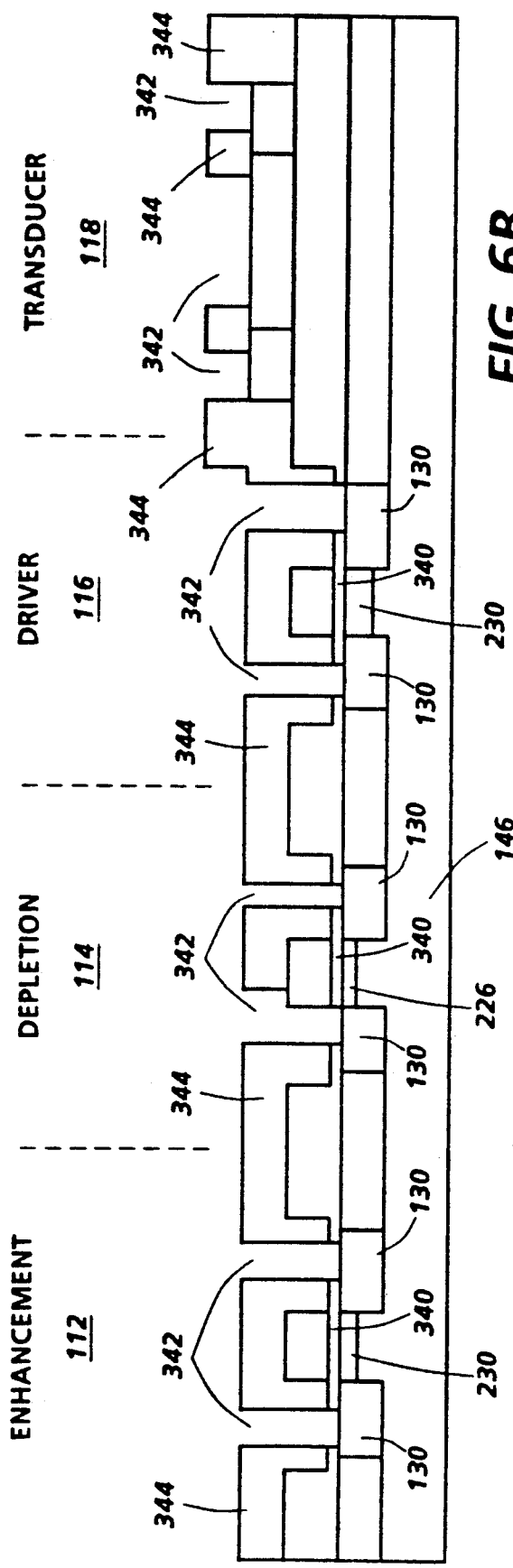
Figure 6C:
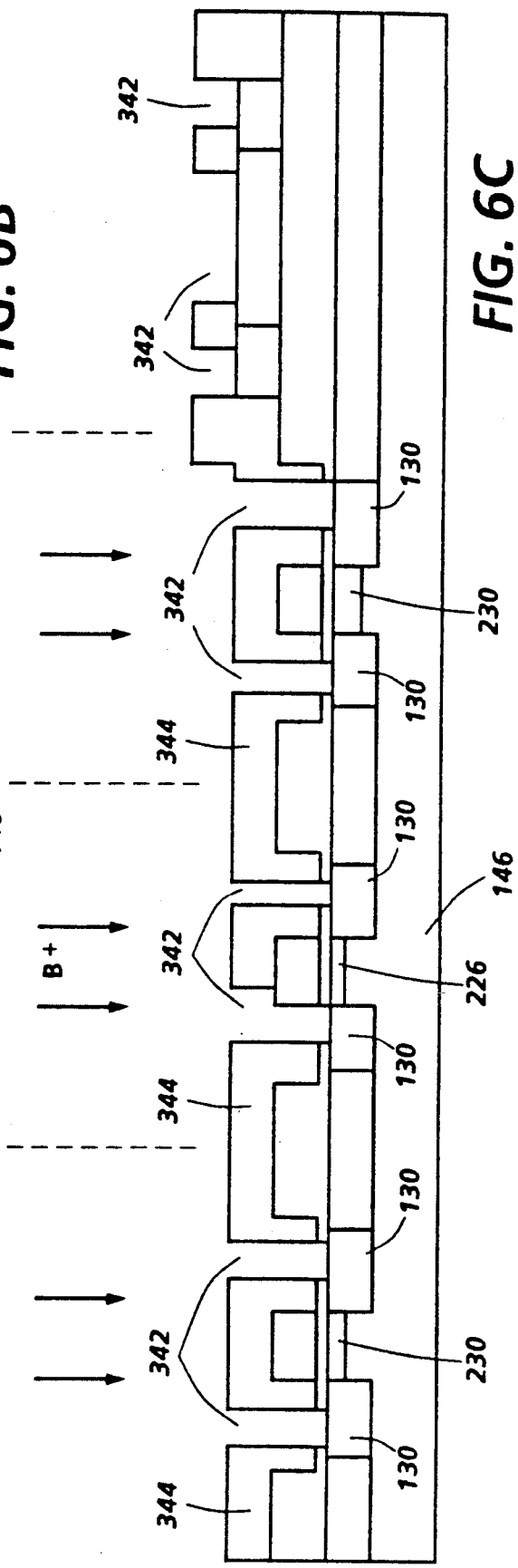

FIGS. 6a–6c illustrate the process modifications to the process steps delineated in FIGS. 5a–5e which are enabled by use of the BPSG reflow in place of the PSG reflow illustrated in FIG. 5d. This alternate fabrication process is identical with the above described invention through the process step of FIG. 5b. Referring now to FIG. 6a, the photoresist mask 332 has been modified from mask 232 in FIG. 5c to expose the lightly doped source-drain regions 132 of FIG. 5D to the phosphorous source-drain implant. Subsequent to the phosphorous implant, the borophosphosilicate glass 344 is reflowed over the surface of the wafer for a period of about 30 minutes, and at a temperature of about 950° C. The lower temperature and shorter time period substantially limits the lateral diffusion of the phosphorous in the channel regions 226 and 230. Next, patterning and etch procedures are applied to BPSG layer 344 to produce vias 342 therein, exposing the wafer surface through thermal oxide layer 340 as illustrated in FIG. 6b. The resulting vias 342 provide access to the source-drain contact regions 130. More importantly, use of BPSG, and the reduced time of the reflow cycle further reduces or eliminates the requirement for the set-back of the source-drain contacts 130, and n— drift layer 132, as illustrated in FIG. 5c–5e. Accordingly, use of BPSG alone enables the production of electrical contacts having junction depths comparable to those achieved with the prior art.

As in the previously discussed process in FIGS. 5a to 5e, some of the driver source contacts, preferably one in every six, are masked to shield them from the phosphorous implant. These contacts are dispersed about the wafer surface to enable p+ substrate contacts for grounding through the top surface of the wafer, thereby eliminating the parasitic bipolar effect generally associated with grounding through the bottom surface of the wafer. The ground contacts, including every sixth source contact in the driver section, are completed by doping contacts with a self-aligned boron implant as shown in FIG. 6c using the patterned BPSG as a mask. In this step, the BPSG acts as the patterning mechanism for the boron substrate contact implant. Subsequently, the wafer is cleaned and the implants are activated by an additional heating cycle of approximately 30 minutes at about 900° C. Following the implant activation step, the wafer would be completed as previously described in FIG. 4, by producing the silicon nitride transducer insulator and tantalum surface layers, depositing and patterning the aluminum contact layer, and subsequently coating the remainder of the wafer with patterned layers of SiO2, Si3N4, and polyimide. The use of BPSG as the reflow glass also enables the elimination of one photoresist patterning and etch process, by eliminating the need for the separate arsenic implant. Furthermore, the use of the self aligned boron implant, illustrated in FIG. 6c, eliminates the need for a boron implant patterning operation. Ultimately, modification of the process in the manner described will also eliminate 2 patterning operation from the prior art eleven mask process.

In addition, the use of phosphorous, well know for its ability to suppress aluminum-silicon reactions at contacts, would result in a significant reduction in junction spiking in the contact regions.

The two methods which have just been discussed demonstrate that logic and driver elements can be simultaneously fabricated with the resistive transducer elements using a reduced mask/implant step process. Addition of the logic circuitry enables the further reduction in interconnections which becomes important for interfacing to large arrays. The NMOS logic circuits are added by including depletion mode photoresist masking and implant process steps in the fabrication sequence so that normally on and normally off devices are available to form logic gates. The polysilicon which is used to form the resistor elements and gates of drivers is simultaneously used to form the gates of the logic circuit elements.

Generally, reduction in the mask steps required to produce the monolithic integrated circuit for the thermal ink jet printing module would serve to reduce the cost of the module. More specifically, by eliminating two of the eleven mask steps, cost savings in the range of twenty percent can be achieved in the integrated circuit. Therefore, the present invention replaces the separate arsenic (As) source-drain and phosphorous polysilicon masking and implant steps with a single phosphorous masked implant step. In addition, by using a self-aligned boron source-drain implant, an additional mask step is eliminated, resulting in a more efficient nine mask step process.

Many modifications and variations are apparent from the foregoing description of the invention and all such modifications and variations are intended to be within the scope of the present invention.

We claim:

1. A method of fabricating a thermal ink jet printing module having a monolithic integrated circuit which contains logic, driver and resistor elements on the surface of a common silicon wafer, comprising the steps of:
    (a) forming patterned polysilicon gate regions on the gate oxide layer disposed on the surface of the wafer, said gate regions defining gate channels in the wafer thereunder;
    (b) forming, in conjunction with said patterned polysilicon gate regions, patterned polysilicon resistor regions on the field oxide layer disposed on the surface of the wafer;
    (c) forming self-aligned n− drift layers beneath all non-patterned gate oxide regions, while simultaneously doping the polysilicon resistor regions, said self-aligned drift layers being defined by the polysilicon gate regions previously deposited on the wafer;
    (d) masking those regions desired to remain as n− drift layer implants, said n− drift layers preventing lateral diffusion of n-type dopants into the gate channels;
    (e) forming n+ contact regions in all non-masked regions, said n+ contact regions acting in conjunction with adjacent n− drift layers to provide a low resistivity path to the gate channel; and
    (f) simultaneously doping the ends of the polysilicon resistor regions to produce localized areas of lower resistivity, said localized areas to be used as the contact regions for the resistor elements.

2. The method of claim 1, wherein:
    the layer of polysilicon formed in step (a) for the gate regions is about 4500 Å in thickness; and
    the layer of polysilicon formed in step (b) for the resistor regions is about 4500 Å in thickness, said resistor region polysilicon layer having a sheet resistance of about 47 $\Omega/\square$ accomplished by implanting said polysilicon layer with phosphorous.

3. The method of claim 1, wherein the n− drift layers formed in step (c) and the n+ contact regions formed in step (e) are formed by the implantation of phosphorous ions.

4. The method of producing the logic, driver and resistor elements on the wafer according to claim 1, wherein the method further comprises the steps of:
    (g) reflowing a glass layer over the surface of the wafer subsequent to the step of doping the ends of the polysilicon resistor regions to produce localized areas of lower resistivity at step (f);
    (h) etching the reflow glass to produce vias which extend therethrough to the source-drain and resistor contact regions;
    (i) doping the exposed source-drain and resistor contact with a boron implant; and
    (j) subsequently activating the boron implant.

5. The method according to claim 4, wherein the distance of which said n− drift layer masking extends laterally from the gate regions is a function of the time and temperature of subsequent glass reflow operations.

6. The method according to claim 4, wherein said reflow step utilizes a 7.5 percent phosphosilicate glass, which is reflowed for a period of about 90 minutes at a temperature of about 1000° C.

7. The method according to claim 6, wherein said n− drift layer masking at step (d) extends parallel to the surface of the wafer for a distance of about 2.5 μm from the outer edges of the gate channels.

8. The method according to claim 4, wherein said reflow step utilizes a borophosphosilicate glass, which is reflowed for a period of about 30 minutes at a temperature of about 950° C.

9. The method according to claim 4, wherein said boron implant activation at step (j) is accomplished by heating the wafer to a temperature of approximately 1000° C. for a period of about 30 minutes.

10. In the production of a monolithic integrated circuit for use in a thermal ink jet printing module which contains logic, driver and transducer elements on the surface of a common silicon substrate, said transducer elements having n− drift layer implants, the method of producing the n− drift layer implants on a substrate having patterned channel stop implants present therein and field and gate oxide layers disposed on a surface thereof, comprising the steps of:
    forming patterned polysilicon gate regions on the gate oxide layer disposed on the surface of the substrate, said gate regions defining gate channels in the substrate thereunder and source-drain contact regions located adjacent said channels;
    forming, in conjunction with said patterned polysilicon gate regions, patterned polysilicon resistor regions on the field oxide layer disposed on the surface of the substrate;
    simultaneously doping, with phosphorous, said polysilicon resistor and gate regions to achieve a predetermined level of resistivity therein;
    masking specific polysilicon areas desired to remain at the predetermined level of resistivity;
    subsequently doping, with phosphorous, the exposed polysilicon and silicon substrate layers to produce logic and driver element source-drain contact regions and lower resistivity polysilicon resistor contact regions;
    subsequently reflowing a borophosphosilicate glass over the surface of the substrate to substantially cover the surface thereof;
    etching the reflow glass to produce vias to the source-drain and resistor contact regions.

11. The method according to claim 10, wherein the borophosphosilicate glass is reflowed at a temperature of about 950° C. for a period of about 30 minutes.

12. A method of fabricating a thermal ink jet printing module having a monolithic integrated circuit which contains logic, driver and resistor elements on the surface of a common silicon substrate, comprising the steps of:
    (1) forming a thin oxide layer on a planar surface of the silicon substrate;
    (2) patterning the surface with a first photoresist layer, thereby producing masked and unmasked regions on the surface thereof;
    (3) depositing an insulating layer on the unmasked regions of the insulating layer;

(4) stripping said first photoresist layer, thereby exposing the underlying thin oxide layer beneath the masked regions;

(5) ion implanting the silicon substrate through the thin oxide layer to produce channel stops in the silicon beneath regions previously masked by photoresist layer one;

(6) etching the thin oxide layer to expose the silicon substrate below;

(7) growing a field oxide layer on the exposed silicon surfaces;

(8) stripping the insulating layer deposited in step 3, and the underlying thin oxide layer, to expose the underlying silicon substrate;

(9) forming a sacrificial oxide layer over the substrate surfaces exposed in step 8;

(10) patterning the substrate with a second photoresist layer, wherein the unmasked portions bounded by said second photoresist layer define the depletion logic regions of the underlying substrate;

(11) ion implanting the depletion logic regions of the substrate with a n-type depletion mode dopant;

(12) stripping said second photoresist layer, and etching the substrate to remove the sacrificial oxide layer and expose the silicon substrate therebelow;

(13) forming a gate oxide layer on the exposed silicon substrate;

(14) ion implanting the substrate surface with a p-type dopant to produce a p-type enhancement mode implant;

(15) depositing a single polysilicon layer over the surface of the substrate;

(16) ion implanting said polysilicon layer with n-type ions to reduce the sheet resistance of said polysilicon layer;

(17) patterning the polysilicon layer with a third photoresist layer, the masked regions defining gate and resistor semiconductive polysilicon regions and the unmasked regions being subsequently etched away, whereby said gate polysilicon regions further define gate channels therebelow, within the silicon substrate, and whereby said polysilicon resistor regions are disposed on the upper surface of the field oxide layer;

(18) stripping said third photoresist layer, thereby exposing the underlying polysilicon gate and resistor regions;

(19) lightly implanting n-type ions in the substrate surface, thereby producing self-aligned drift layers within the silicon between the channels and the channel stops;

(20) patterning the substrate with a fourth photoresist layer, said layer thereby masking portions of the gate and resistor polysilicon regions and portions of said drift layers;

(21) ion implanting the the substrate surface with an n-type dopant, thereby producing n-type contacts within the unmasked silicon regions and producing lower resistivity regions in the unmasked polysilicon layer;

(22) stripping said fourth photoresist layer to expose the underlying silicon and polysilicon layers;

(23) cleaning the upper surface of the substrate;

(24) growing a protective oxide layer over the upper surface of the substrate;

(25) reflowing glass over the upper surface of the substrate to form a glass layer thereon;

(26) patterning the glass layer with a fifth photoresist layer placed thereon, said photoresist layer creating both masked and unmasked areas on the glass surface;

(27) etching the unmasked areas of the glass surface to remove the underlying glass and protective oxide layers, thereby creating vias within the glass layer, said vias extending through the glass and oxide layers to the n-type contacts therebelow;

(28) ion implanting the surface of the substrate with a self-aligned p-type dopant to convert the n-type contacts to source-drain contacts;

(29) cleaning the surface of the substrate;

(30) activating the source-drain contacts by thermally treating the substrate;

(31) applying a contact metal layer to the surface of the substrate, said metal layer extending through said vias to provide electrical contact to the source-drain contacts;

(32) patterning the contact metal layer with a sixth photoresist layer, said sixth photoresist layer creating masked and unmasked areas on the underlying contact metal layer;

(33) etching the contact metal layer to remove the unmasked areas, thereby leaving only the masked areas to form contacts and circuit interconnections for the logic, driver and resistor elements;

(34) stripping the sixth photoresist layer;

(35) depositing a second insulating layer over the surface of the substrate;

(36) depositing a protective metal on top of the second insulating layer;

(37) patterning said protective metal layer with a seventh photoresist layer, said seventh photoresist layer having masked areas located over the central portion of said polysilicon resistor regions;

(38) etching said protective metal layer, thereby exposing the second insulating layer thereunder;

(39) stripping the seventh photoresist layer to expose the protective metal layer located over the central portion of said polysilicon resistor regions; and

(40) etching said second insulating layer while using said protective metal layer as a mask, to remove all of the second protective layer except for that portion of the layer located over the central portion of said polysilicon resistor regions, said substrate now having a monolithic circuit disposed thereon;

(41) depositing a protective oxide layer over the surface of the substrate;

(42) patterning said protective oxide layer with an eighth photoresist layer to expose at least the central portion of the resistor region;

(43) depositing a polyimide layer over the entire surface of the substrate; and

(44) patterning said polyimide layer with a ninth photoresist layer to expose at least the central portion of the resistor region.

* * * * *